(12) United States Patent
Chen et al.

(10) Patent No.: US 10,631,639 B2
(45) Date of Patent: *Apr. 28, 2020

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/131,185

(22) Filed: Sep. 14, 2018

(65) Prior Publication Data
US 2019/0298060 A1    Oct. 3, 2019

(30) Foreign Application Priority Data
Apr. 2, 2018    (TW) .................................. 107112012

(51) Int. Cl.
*A47B 88/44*    (2017.01)
*A47B 88/47*    (2017.01)
(Continued)

(52) U.S. Cl.
CPC ............ *A47B 88/44* (2017.01); *A47B 88/447* (2017.01); *A47B 88/473* (2017.01);
(Continued)

(58) Field of Classification Search
CPC .... A47B 2210/0016; A47B 2210/0018; A47B 2210/0064; A47B 2210/0067; A47B 2210/007; A47B 2210/0081; A47B 2088/0403; A47B 88/403; A47B 88/44; A47B 88/443; A47B 88/447;
(Continued)

(56) References Cited

U.S. PATENT DOCUMENTS 5,484,197 A * 1/1996 Hansen .................. A47B 88/42
312/334.12
6,297,962 B1 * 10/2001 Johnson ............... H05K 7/1421
248/535
(Continued)

*Primary Examiner* — Andrew M Roersma
(74) *Attorney, Agent, or Firm* — Rosenberg, Klein & Lee

(57) ABSTRACT

A slide rail assembly includes a first rail, a second rail, a blocking member, and an operating member. The rails are displaceable with respect to each other. The blocking member is coupled to the first rail. The operating member can enter a predetermined state with respect to the second rail. When the second rail is at a predetermined position with respect to the first rail, the operating member is in the predetermined state and blocked by the blocking member to prevent the second rail from displacement from the predetermined position in a predetermined direction. When the operating member is not in the predetermined state and hence not blocked by the blocking member, the second rail can be displaced from the predetermined position in the predetermined direction.

17 Claims, 10 Drawing Sheets

(51) Int. Cl.
*A47B 88/49* (2017.01)
*A47B 88/48* (2017.01)
*H05K 7/14* (2006.01)
*A47B 88/473* (2017.01)
*A47B 88/483* (2017.01)
*A47B 88/447* (2017.01)

(52) U.S. Cl.
CPC ............ *A47B 88/483* (2017.01); *A47B 88/49* (2017.01); *H05K 7/1489* (2013.01); *A47B 2210/007* (2013.01); *A47B 2210/0016* (2013.01); *A47B 2210/0064* (2013.01); *A47B 2210/0067* (2013.01)

(58) Field of Classification Search
CPC ..... A47B 88/473; A47B 88/477; A47B 88/40; A47B 88/483; A47B 88/49; A47B 88/08
See application file for complete search history.

(56) References Cited

U.S. PATENT DOCUMENTS

| | | | |
|---|---|---|---|
| 7,318,532 B1* | 1/2008 | Lee | H05K 7/1405 211/26 |
| 7,364,244 B2 | 4/2008 | Sandoval | |
| 8,282,176 B1 | 10/2012 | Chen et al. | |
| 8,403,432 B2* | 3/2013 | Chen | A47B 88/43 312/333 |
| 9,538,845 B1* | 1/2017 | Chen | A47B 88/49 |
| 10,231,540 B1* | 3/2019 | Hong | A47B 88/477 |
| 10,376,054 B1* | 8/2019 | Chen | A47B 88/403 |
| 2017/0082143 A1* | 3/2017 | Chen | F16C 29/12 |
| 2019/0082836 A1* | 3/2019 | Chen | A47B 88/473 |

* cited by examiner

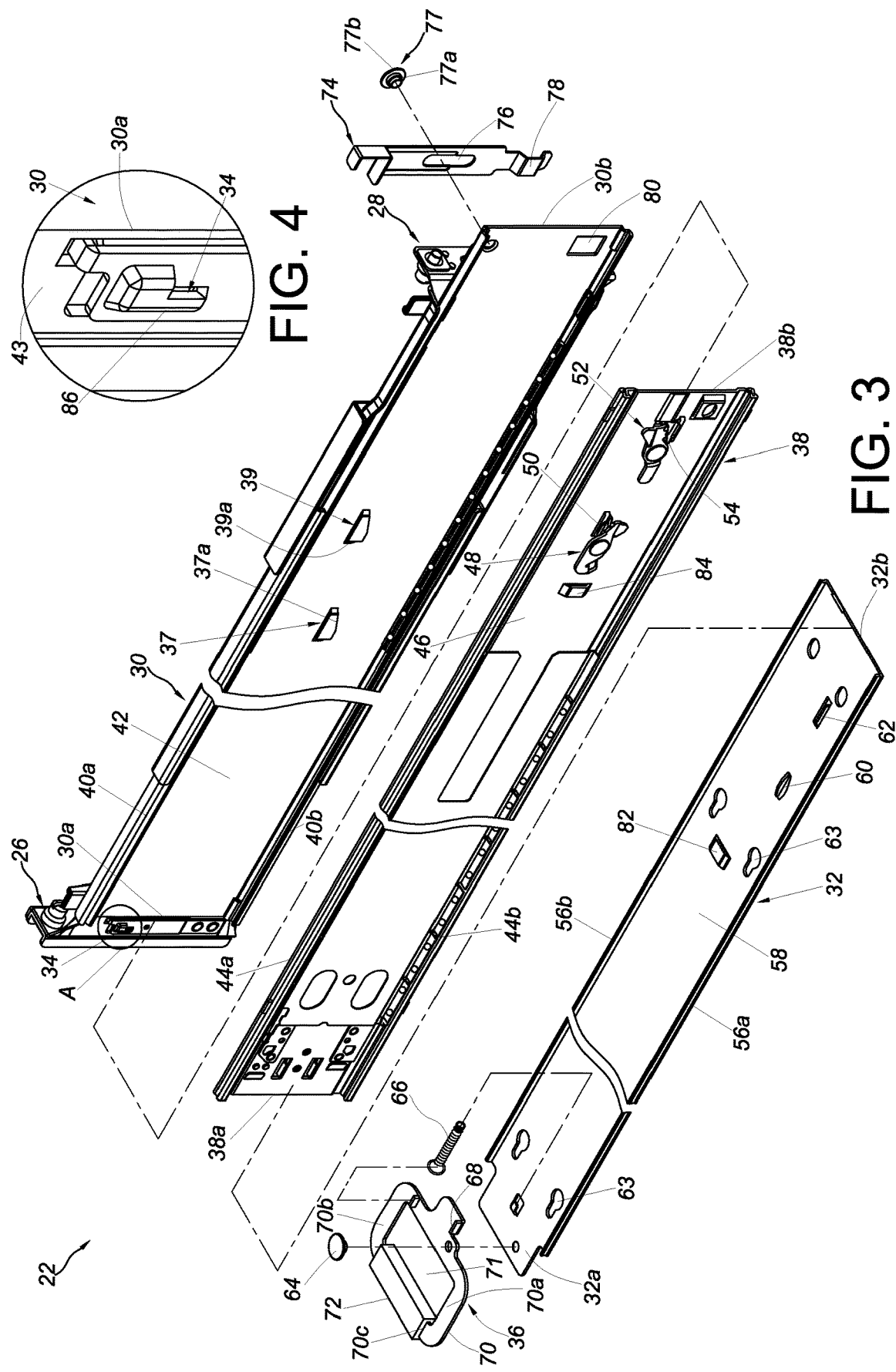

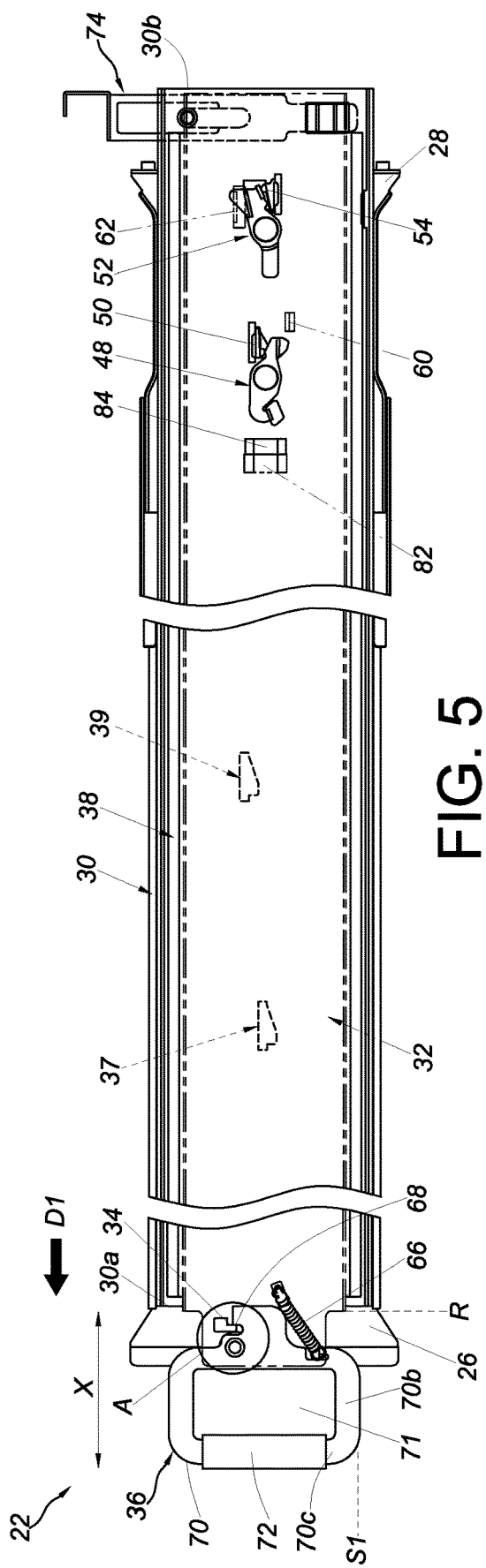
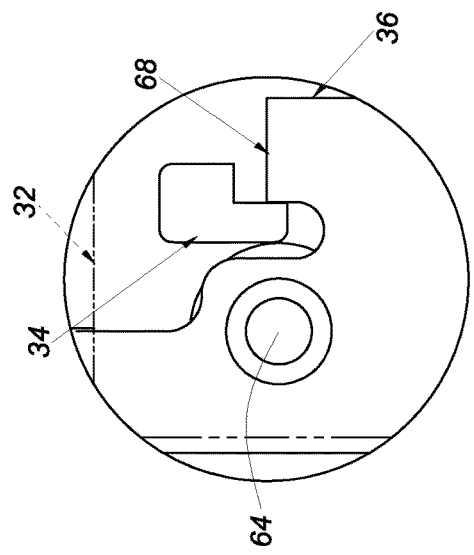
FIG. 5
FIG. 6

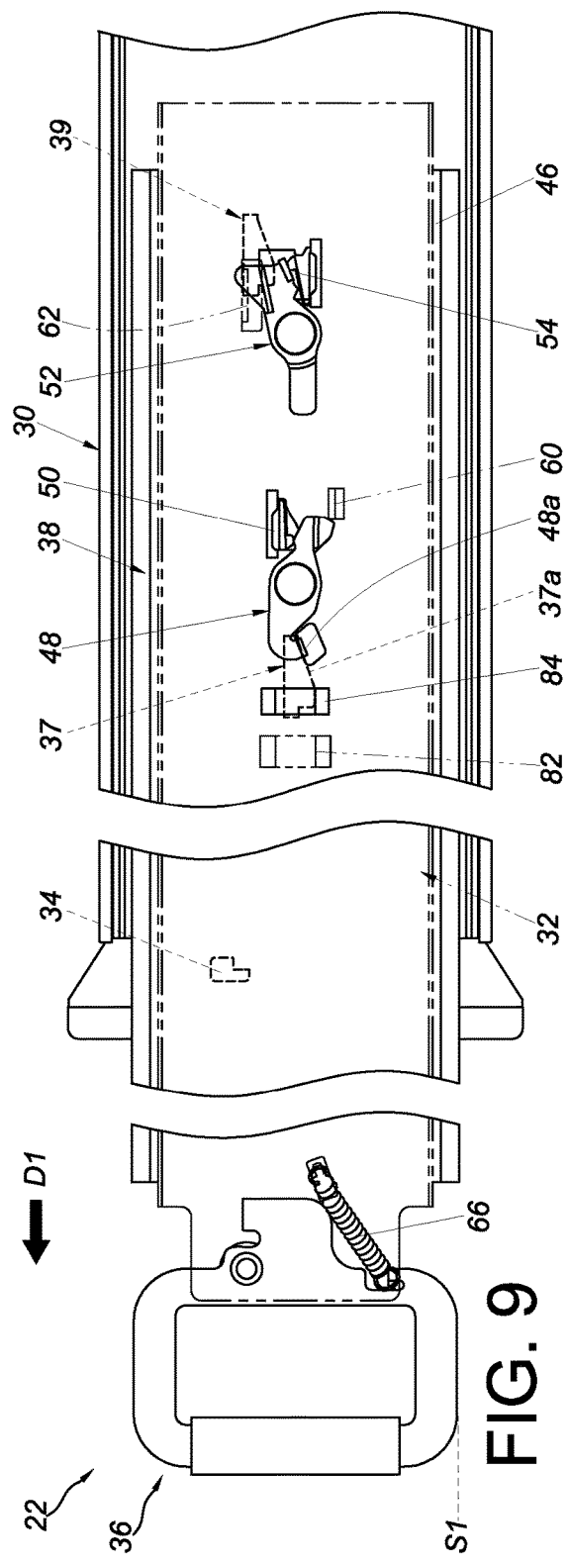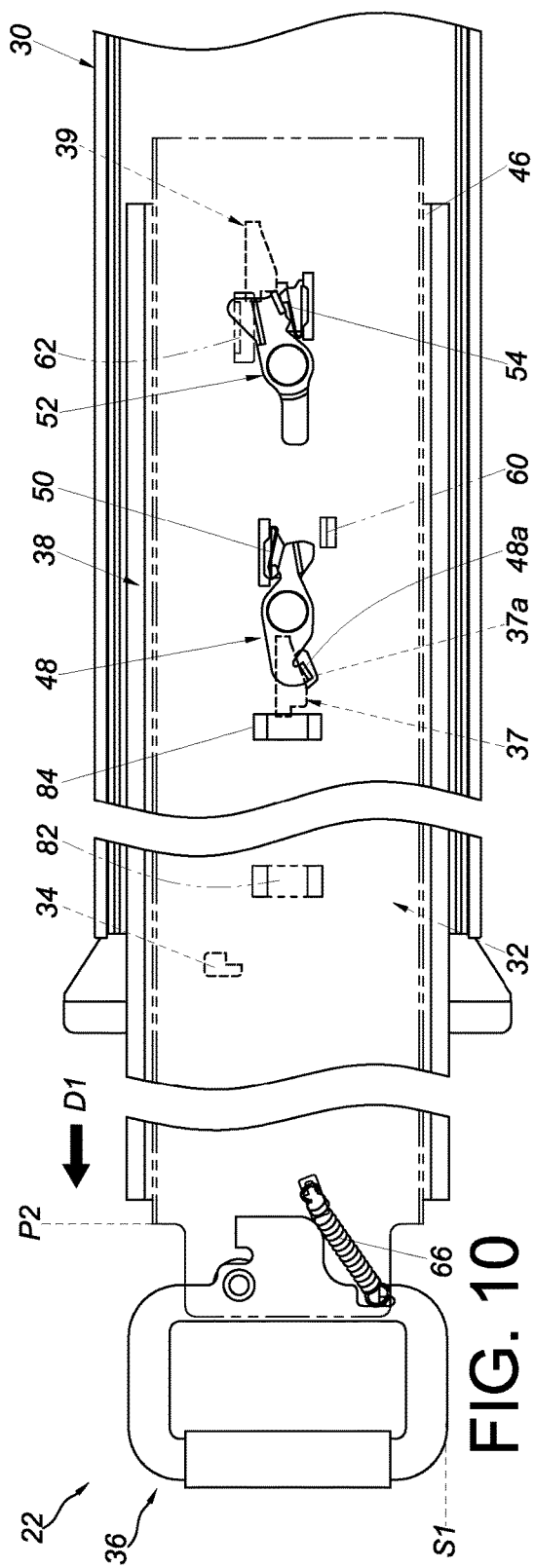

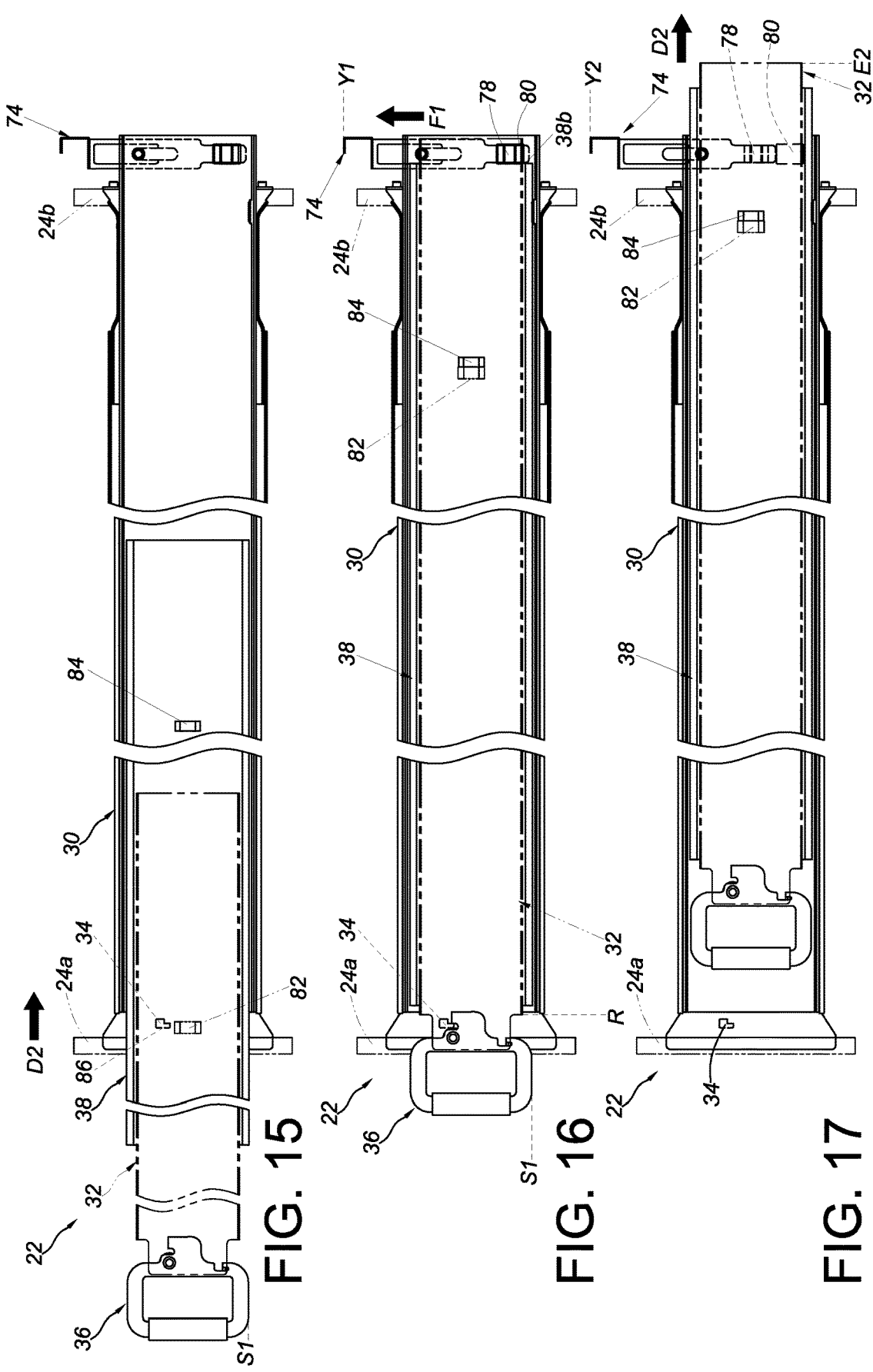

SLIDE RAIL ASSEMBLY

FIELD OF THE INVENTION

The present invention relates to slide rails and more particularly to a slide rail assembly capable of preventing a slide rail thereof from being displaced with respect to another slide rail thereof from a predetermined position in a certain direction.

BACKGROUND OF THE INVENTION

U.S. Pat. No. 8,282,176 B1 discloses a slide rail assembly that includes an outer rail (10), a middle rail (14), and an inner rail (12). The middle rail (14) is movably mounted between the outer rail (10) and the inner rail (12) to increase the distance for which the inner rail (12) can be displaced with respect to the outer rail (10). The inner rail (12) is equipped with a release member (22). A locking member (20) can work with a stop block (18) of the bracket (102) of the outer rail (10) to prevent the inner rail (12) from being pulled out unintentionally with respect to the outer rail (10). According to FIG. 6 and FIG. 7 accompanying the specification of the US patent, the locking member (20) is moved out of engagement with the stop block (18) by an inclined surface (34) of the release member (22) when the release member (22) is pulled out longitudinally in the arrow-indicated direction, thus allowing the inner rail (12) to be pulled out freely with respect to the outer rail (10).

To cater for different market demands, the development of a different slide rail product has been an issue not to be ignored in the slide rail industry.

SUMMARY OF THE INVENTION

The present invention relates to a slide rail assembly capable of preventing a slide rail thereof from being displaced with respect to another slide rail thereof from a predetermined position in a certain direction.

According to one aspect of the present invention, a slide rail assembly includes a first rail, a second rail, a blocking member, and an operating member. The second rail and the first rail can be longitudinally displaced with respect to each other. The blocking member is coupled to the first rail. The operating member can enter a predetermined state with respect to the second rail. When the second rail is at a retracted position with respect to the first rail, the operating member is in the predetermined state and is blocked by the blocking member such that the second rail is prevented from being displaced from the retracted position in a first direction. When the operating member is not in the predetermined state, the operating member is no longer blocked by the blocking member and therefore allows the second rail to be displaced from the retracted position in the first direction.

Preferably, the operating member includes a handle portion, wherein the handle portion has a plurality of walls, and the walls jointly define an operating space.

Preferably, the first rail includes a first end portion and a second end portion opposite the first end portion. When the second rail is at the retracted position with respect to the first rail, the handle portion of the operating member extends beyond the first end portion of the first rail by a predetermined distance. When the handle portion of the operating member is operated, the operating member is moved out of the predetermined state.

Preferably, the slide rail assembly further includes a third rail movably mounted between the first rail and the second rail.

Preferably, the operating member is movably arranged on the second rail.

Preferably, the operating member is pivotally connected to the second rail via a shaft, and the slide rail assembly further includes an elastic component for applying an elastic force to the operating member and thereby keeping the operating member in the predetermined state.

Preferably, the handle portion and the blocking portion of the operating member are located on two sides of the shaft respectively.

Preferably, the operating member further includes a blocking portion, and the operating member in the predetermined state is blocked by the blocking member through the blocking portion.

Preferably, the slide rail assembly further includes a first element and a first elastic element. The first element is pivotally connected to the third rail. The first elastic element applies an elastic force to the first element. When the second rail reaches a first position after being displaced from the retracted position in the first direction, a first feature of the second rail abuts against the first element so that the third rail and the second rail can be simultaneously displaced in the first direction.

Preferably, the slide rail assembly further includes a first working feature arranged on the first rail, and the first working feature includes a disengaging section. When the third rail and the second rail reach a second position after being simultaneously displaced with respect to the first rail in the first direction, the disengaging section of the first working feature moves the first element and thereby terminates the simultaneous displacement relationship between the third rail and the second rail.

Preferably, the slide rail assembly further includes a second working feature arranged on the first rail, and the slide rail assembly further includes a second element and a second elastic element. The second working feature includes a blocking section. The second element is pivotally connected to the third rail, and the second elastic element applies an elastic force to the second element. When the third rail reaches a third position after being displaced with respect to the first rail in the first direction, the second element is engaged with the blocking section of the second working feature in response to the elastic force of the second elastic element; thus, the third rail is prevented from being displaced with respect to the first rail in the opposite direction of the first direction (hereinafter referred to as the second direction).

Preferably, when the second rail reaches a predetermined position after being displaced from an extended position with respect to the third rail in the second direction, a second feature of the second rail moves the second element out of engagement with the blocking section of the second working feature, thereby allowing the third rail to be displaced with respect to the first rail in the second direction.

Preferably, one of the blocking member and the operating member has a guiding portion. When the second rail reaches a position close to the retracted position after being displaced in the second direction, the guiding portion guides the operating member to move past the blocking member, thereby allowing the second rail to be retracted to the retracted position.

Preferably, slide rail assembly further includes a blocking element. When the second rail and the third rail are at the retracted position, the blocking element is in a blocking state to prevent one of the third rail and the second rail from being displaced from the retracted position in the second direction. When the blocking element is not in the blocking state, one of the third rail and the second rail can be displaced from the retracted position to a second extended position with respect to the first rail in the second direction.

Preferably, the blocking member is adjacent to the first end portion of the first rail, and the blocking element is adjacent to the second end portion of the first rail.

Preferably, the first end portion and the second end portion of the first rail are a front portion and a rear portion of the first rail respectively.

Preferably, the second rail and the third rail have a first abutting portion and a second abutting portion respectively. When one of the third rail and the second rail is displaced from the retracted position with respect to the first rail in the second direction, the first abutting portion of the second rail and the second abutting portion of the third rail can abut against each other so that the third rail and the second rail can be simultaneously displaced from the retracted position with respect to the first rail in the second direction.

BRIEF DESCRIPTION OF THE DRAWINGS

FIG. 3 is an exploded perspective view of the slide rail assembly according to an embodiment of the present invention;

FIG. 4 is an enlarged view of the circled area A in FIG. 3;

FIG. 5 is a schematic view of the slide rail assembly according to an embodiment of the present invention, wherein the slide rail assembly is in a retracted state;

FIG. 6 is an enlarged view of the circled area A in FIG. 5;

FIG. 9 is a schematic view showing that the second rail and the third rail of the slide rail assembly according to an embodiment of the present invention is further displaced with respect to the first rail in the first direction;

FIG. 10 is a schematic view showing that the second rail and the third rail of the slide rail assembly according to an embodiment of the present invention is displaced still further with respect to the first rail in the first direction;

FIG. 15 is a schematic view showing that the second rail and the third rail of the slide rail assembly according to an embodiment of the present invention is displaced still further with respect to the first rail in the second direction;

FIG. 16 is a schematic view showing that the slide rail assembly according to an embodiment of the present invention is in the retracted state; and FIG. 17 is a schematic view showing that the second rail and the third rail of the slide rail assembly according to an embodiment of the present invention is displaced from a retracted position with respect to the first rail in the second direction, bringing the slide rail assembly into another extended state.

DETAILED DESCRIPTION OF THE INVENTION

Figure 1:
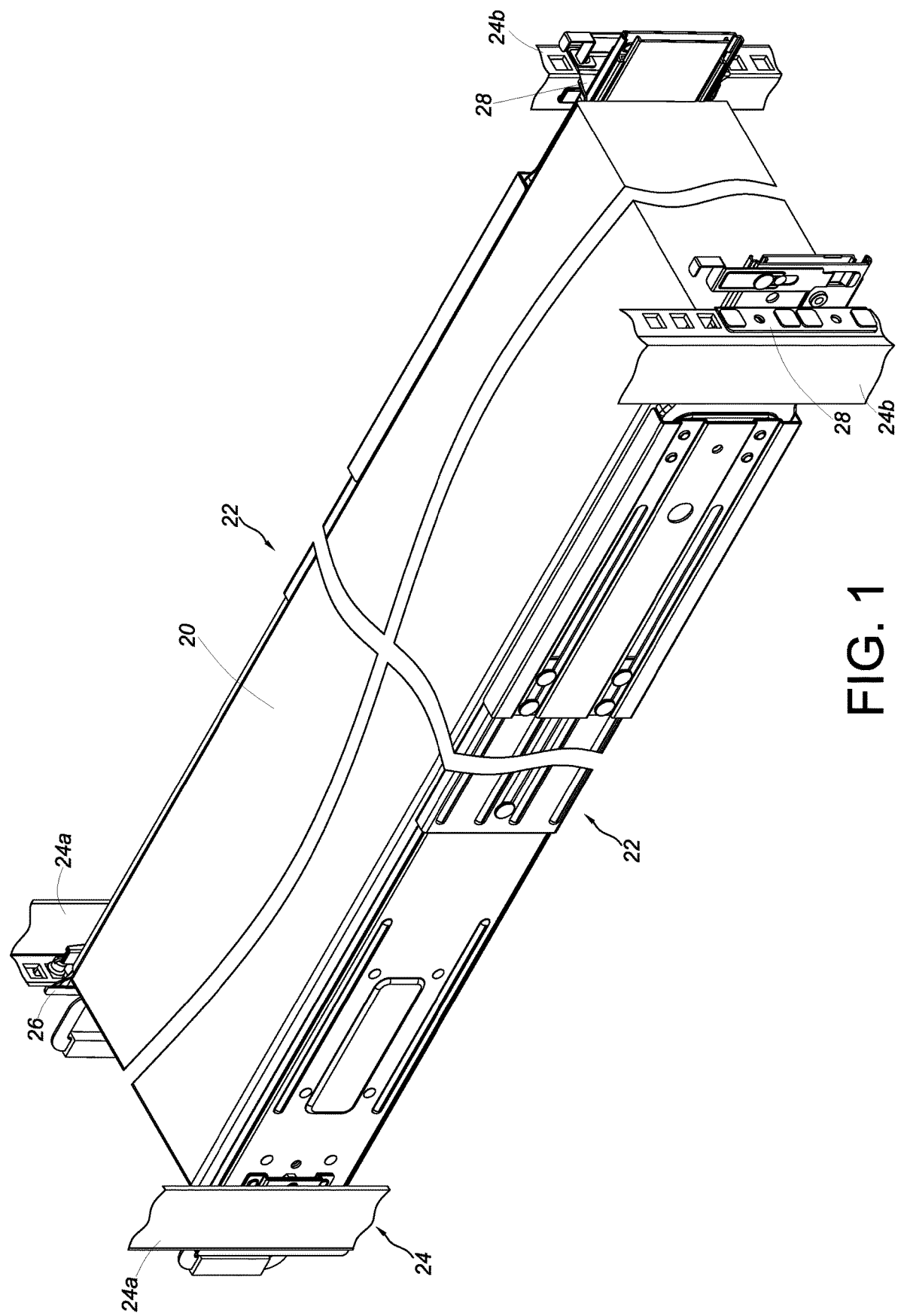
FIG. 1 is a perspective view of the rack system according to an embodiment of the present invention.

FIG. 1 shows how an object 20 in a rack system is mounted on a rack 24 via a pair of slide rail assemblies 22 according to an embodiment of the present invention. More specifically, each slide rail assembly 22 is mounted on a corresponding first post 24a and a corresponding second post 24b of the rack 24 through a first bracket 26 and a second bracket 28 respectively.

Figure 2:
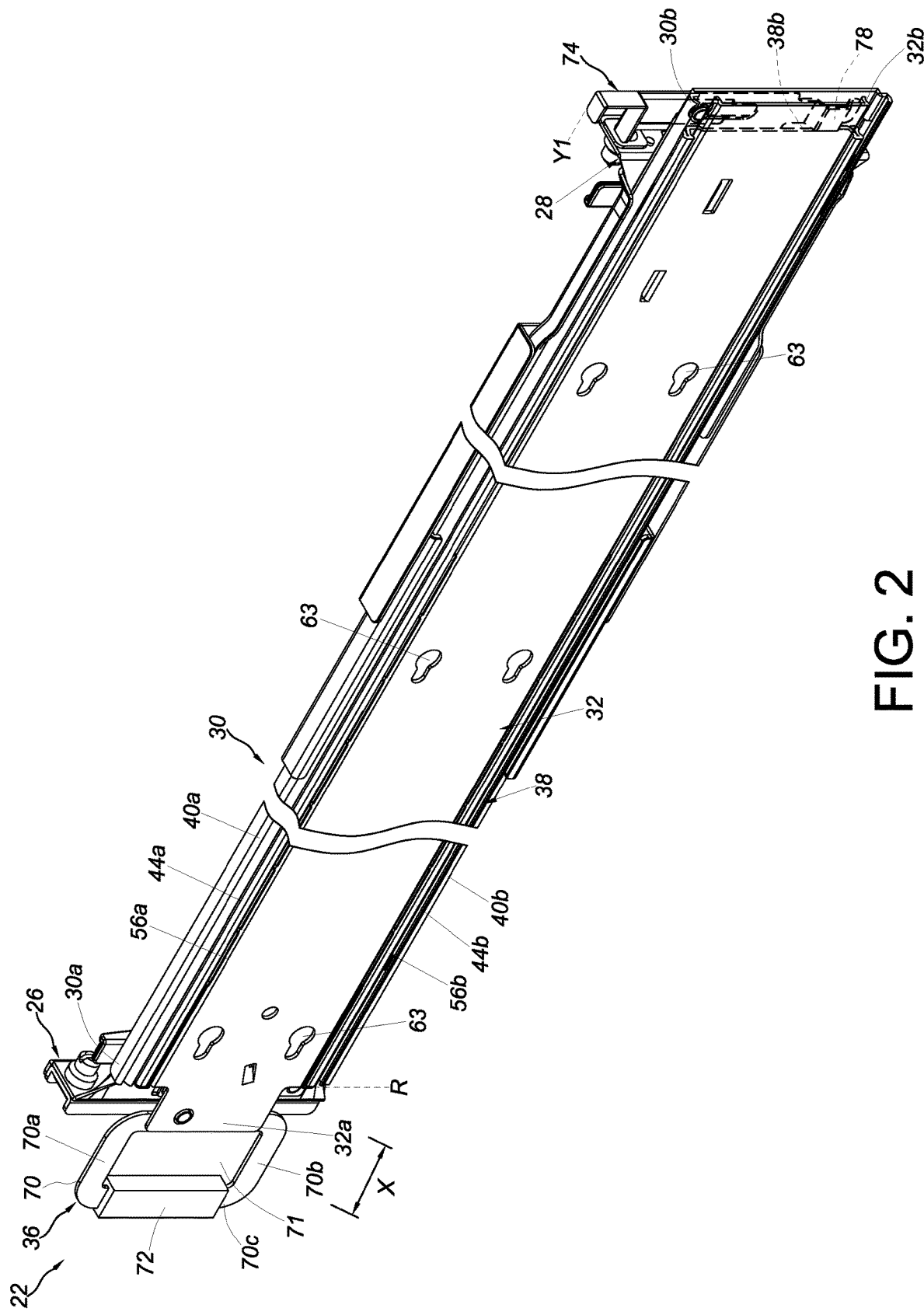
FIG. 2 is a perspective view of the slide rail assembly according to an embodiment of the present invention, wherein the slide rail assembly is in a retracted state.

Referring to FIG. 2 and FIG. 3, the slide rail assembly 22 includes a first rail 30, a second rail 32, a blocking member 34, an operating member 36, and preferably also a third rail 38 movably mounted between the first rail 30 and the second rail 32 to increase the distance for which the second rail 32 can be longitudinally displaced with respect to the first rail 30.

The first rail 30 includes a first end portion 30a and a second end portion 30b, which correspond to the two opposite ends of the first rail 30 respectively. For example, the first end portion 30a and the second end portion 30b of the first rail 30 may be, but are not limited to, a front portion and a rear portion of the first rail 30 respectively. The first bracket 26 is fixed on the first rail 30 and therefore can be viewed as part of the first rail 30. Preferably, the first bracket 26 is adjacent to the first end portion 30a of the first rail 30. The second bracket 28 is coupled to the first rail 30 and can be adjusted in position with respect to the first rail 30. For example, the second bracket 28 can be adjusted to a position adjacent to the second end portion 30b of the first rail 30. The first rail 30 is mountable on the corresponding first post 24a and the corresponding second post 24b via the first bracket 26 and the second bracket 28 respectively, which configuration is well known to a person of ordinary skill in the art and, for the sake of brevity therefore, will not be described any further. The first rail 30 includes a first wall 40a, a second wall 40b, and a longitudinal wall 42 connected between the first wall 40a and the second wall 40b of the first rail 30. The first wall 40a, the second wall 40b, and the longitudinal wall 42 jointly define a first channel.

The blocking member 34 is coupled to the first rail 30 (as can be seen more clearly in FIG. 4). For example, the blocking member 34 may be integrated with the first rail 30 or be a separate component coupled, and movably or detachably connected, to the first rail 30. The present invention imposes no limitation on how to couple the blocking member 34 to the first rail 30. As another example, the blocking member 34 may be mounted on the first bracket 26 or the corresponding first post 24a. In this embodiment, the blocking member 34 is coupled to a lateral portion 43 of the first bracket 26 of the first rail 30, and the blocking member 34 is a projection or a protruding block adjacent to the first end portion 30a of the first rail 30 by way of example. Preferably, the slide rail assembly 22 further includes a first working feature 37 and a second working feature 39 arranged at two positions on the first rail 30 respectively. Here, the first working feature 37 and the second working feature 39 are two projections arranged on the longitudinal wall 42 of the first rail 30 but are not necessarily so in practice.

The third rail 38 is movably mounted in the first channel of the first rail 30. The third rail 38 and the first rail 30 can be longitudinally displaced with respect to each other. The third rail 38 includes a first end portion 38a and a second end portion 38b, which correspond to the two opposite ends of the third rail 38 respectively. The third rail 38 includes a first wall 44a, a second wall 44b, and a longitudinal wall 46 connected between the first wall 44a and the second wall 44b of the third rail 38. The first wall 44a, the second wall 44b, and the longitudinal wall 46 jointly define a second channel. Preferably, the slide rail assembly 22 further includes a first element 48, a first elastic element 50, a second element 52, and a second elastic element 54. The first element 48 and the second element 52 are arranged at two positions on the third rail 38 respectively. More specifically, the first element 48 is pivotally connected to the third rail 38, with the first elastic element 50 applying an elastic force to the first element 48, and the second element 52 is also pivotally connected to the third rail 38, with the second elastic element 54 applying an elastic force to the second element 52.

The second rail 32 and the first rail 30 can be longitudinally displaced with respect to each other. Here, by way of example, the second rail 32 is movably mounted in the second channel of the third rail 38 so as to be longitudinally displaceable with respect to the third rail 38 or the first rail 30. More specifically, the second rail 32 includes a first end portion 32a and a second end portion 32b, which correspond to the two opposite ends of the second rail 32 respectively. The second rail 32 includes a first wall 56a, a second wall 56b, and a longitudinal wall 58 connected between the first wall 56a and the second wall 56b of the second rail 32. Preferably, the second rail 32 further includes a first feature 60 and a second feature 62. Here, the first feature 60 and the second feature 62 are two projections arranged on the longitudinal wall 58 of the second rail 32 by way of example. Preferably, the second rail 32 further includes a plurality of mounting features 63, such as mounting holes, to which the corresponding mounting features of an object to be carried by the second rail 32 can be mounted in order for the second rail 32 to carry the object.

The operating member 36 is arranged on the second rail 32. Preferably, the operating member 36 is arranged adjacent to the first end portion 32a of the second rail 32. Preferably, the operating member 36 is movably arranged on the second rail 32. For example, the operating member 36 is pivotally connected to the second rail 32 via a shaft 64 so as to be pivotable with respect to the second rail 32. Preferably, the slide rail assembly 22 further includes an elastic component 66 for applying an elastic force to the operating member 36. Preferably, the operating member 36 includes a blocking portion 68 and a handle portion 70, and the handle portion 70 and the blocking portion 68 (such as a projection) are located on two sides of the shaft 64 respectively. Preferably, the handle portion 70 of the operating member 36 has a plurality of walls, such as a first sidewall 70a, a second sidewall 70b, and a third sidewall 70c connected together, and the walls jointly define an operating space 71. Preferably, the third sidewall 70c is equipped with a protective cover 72 to facilitate gripping by a user.

Preferably, the blocking member 34 is adjacent to the first end portion 30a of the first rail 30. Preferably, the slide rail assembly 22 further includes a blocking element 74 movably arranged on the first rail 30; in practice, however, the blocking element 74 may not be so arranged. For example, the blocking element 74 may be arranged on the second bracket 28 or the corresponding second post instead. Preferably, the blocking element 74 is adjacent to the second end portion 30b of the first rail 30. More specifically, one of the blocking element 74 and the first rail 30 has a guiding structure 76 to facilitate relative movement between the blocking element 74 and the first rail 30. Here, it is the blocking element 74 that has the guiding structure 76, and the guiding structure 76 is a slot or elongated groove by way of example. Preferably, a connecting element 77 has a first portion 77a extending through the guiding structure 76 to connect with the first rail 30 and has a second portion 77b connected to the first portion 77a, wherein the second portion 77b is wider than the first portion 77a and the guiding structure 76 so as to be stopped on one side of the blocking element 74. Preferably, the connecting element 77 is a screw for locking the blocking element 74 to the first rail 30 such that the blocking element 74 is detachably mounted on the first rail 30 (but not necessarily so in practice). Preferably, the blocking element 74 and the first rail 30 include a first engaging feature 78 and a second engaging feature 80 respectively, and the two engaging features are configured to work with each other. The first engaging feature 78 of the blocking element 74 is engaged with the second engaging feature 80 of the first rail 30 when the blocking element 74 is in a blocking state, and the first engaging feature 78 of the blocking element 74 is disengaged from the second engaging feature 80 of the first rail 30 when the blocking element 74 is not in the blocking state. Preferably, one of the first engaging feature 78 and the second engaging feature 80 is a projection, and the other is a matching hole (or groove). Here, by way of example, the first engaging feature 78 is a projection, and the second engaging feature 80 is a hole.

Preferably, referring to FIG. 5 and FIG. 6, the first working feature 37 and the second working feature 39 are arranged on the first rail 30 in such a way that the two working features are longitudinally spaced apart, and vertically offset, from each other; the first element 48 and the second element 52 are arranged on the third rail 38 in such a way that the two elements are longitudinally spaced apart from each other and are subjected to the elastic force of the first elastic element 50 and the second elastic element 54 respectively; and the first feature 60 and the second feature 62 of the second rail 32 are longitudinally spaced apart, and vertically offset, from each other. Preferably, the second rail 32 and the third rail 38 have a first abutting portion 82 and a second abutting portion 84 respectively, and the first abutting portion 82 and the second abutting portion 84 may be, but are not limited to, protruding blocks or projections.

When the second rail 32 is at a predetermined position, such as a retracted position R, with respect to the first rail 30, the operating member 36 is in a predetermined state S1, in which the operating member 36 is blocked by the blocking member 34 to prevent the second rail 32 from being displaced from the retracted position R in a first direction D1, and in which the handle portion 70 of the operating member 36 extends beyond the first end portion 30a of the first rail 30 by a predetermined distance X in order to be operated with ease. More specifically, the operating member 36 is kept in the predetermined state S1 by the elastic force of the elastic component 66, and the blocking portion 68 of the operating member 36 is blocked by the blocking member 34 to prevent the second rail 32 from being displaced from the retracted position R in the first direction D1. Preferably, the first feature 60 of the second rail 32 and the first element 48 are spaced apart from each other when the second rail 32 and the third rail 38 are at the retracted position R (or in a retracted state) with respect to the first rail 30.

Figure 7:
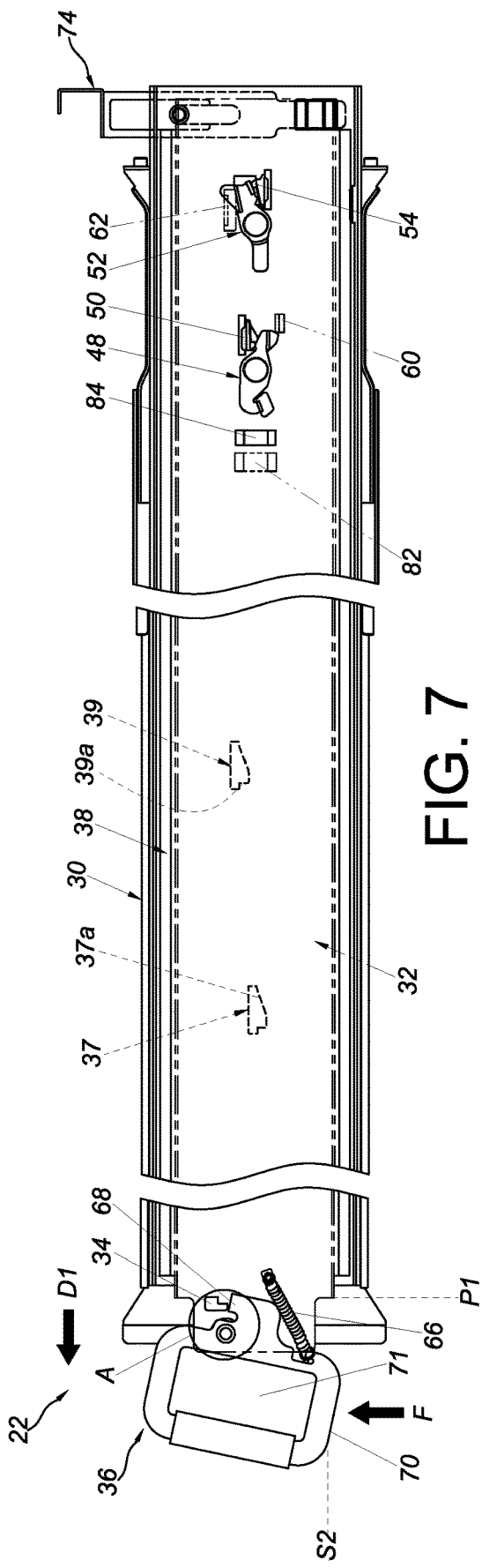
FIG. 7 is a schematic view of the slide rail assembly according to an embodiment of the present invention, wherein the slide rail assembly is in a retracted state and the operating member is operated to allow the second rail and the third rail to be displaced with respect to the first rail in a first direction.
Figure 8:
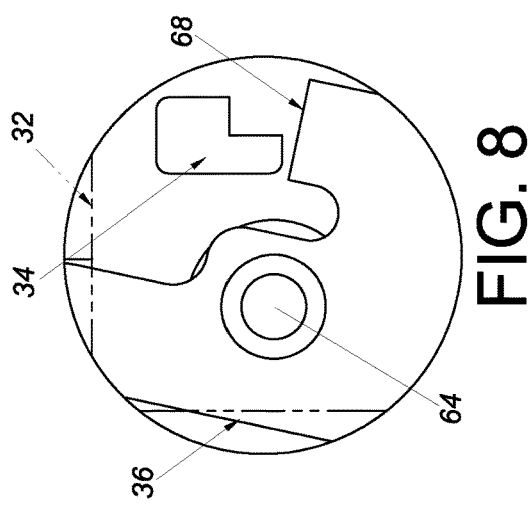
FIG. 8 is an enlarged view of the circled area A in FIG. 7.

When the operating member 36 is not in the predetermined state S1, e.g., when the operating member 36 is operated and thus tilted by an angle from the predetermined state S1 to another state S2 as shown in FIG. 7 and FIG. 8, the operating member 36 is no longer blocked by the blocking member 34 and therefore allows the second rail 32 to be displaced from the retracted position R in the first direction D1. More specifically, a user can operate the handle portion 70 of the operating member 36 by hand, e.g., by inserting one or more fingers into the operating space 71 of the operating member 36 and applying a force F (such as an upward force) to the handle portion 70 to bring the operating member 36 to the second state S2, thereby releasing the blocking portion 68 of the operating member 36 from the blocking member 34 to allow displacement of the second rail 32 in the first direction D1. The elastic component 66 stores an elastic force while the operating member 36 is in the second state S2. Once the second rail 32 reaches a first position P1 after being displaced in the first direction D1, the first feature 60 of the second rail 32 preferably abuts against the first element 48 (see FIG. 7) so that the third rail 38 and the second rail 32 can be simultaneously displaced in the first direction D1.

Once the user stops applying the force F to the operating member 36, referring to FIG. 9 and FIG. 10, the operating member 36 returns from the second state S2 to the predetermined state S1 in response to the elastic force released by the elastic component 66. More specifically, when the third rail 38 and the second rail 32 reach a second position P2 after being simultaneously displaced with respect to the first rail 30 in the first direction D1, a disengaging section 37a (e.g., an inclined or curved surface) of the first working feature 37 tilts the first element 48 by an angle. As a result, the first elastic element 50 stores an elastic force (see FIG. 10), and the first feature 60 of the second rail 32 no longer abuts against the first element 48, meaning the simultaneous displacement relationship between the third rail 38 and the second rail 32 is terminated. The second rail 32 can now be further displaced with respect to the first rail 30 in the first direction D1. It is worth mentioning that the first element 48 has an extension portion 48a extending through the third rail 38 (or more specifically the longitudinal wall 46) toward the first rail 30, and the disengaging section 37a of the first working feature 37 tilts the first element 48 via the extension portion 48a.

Figure 11:
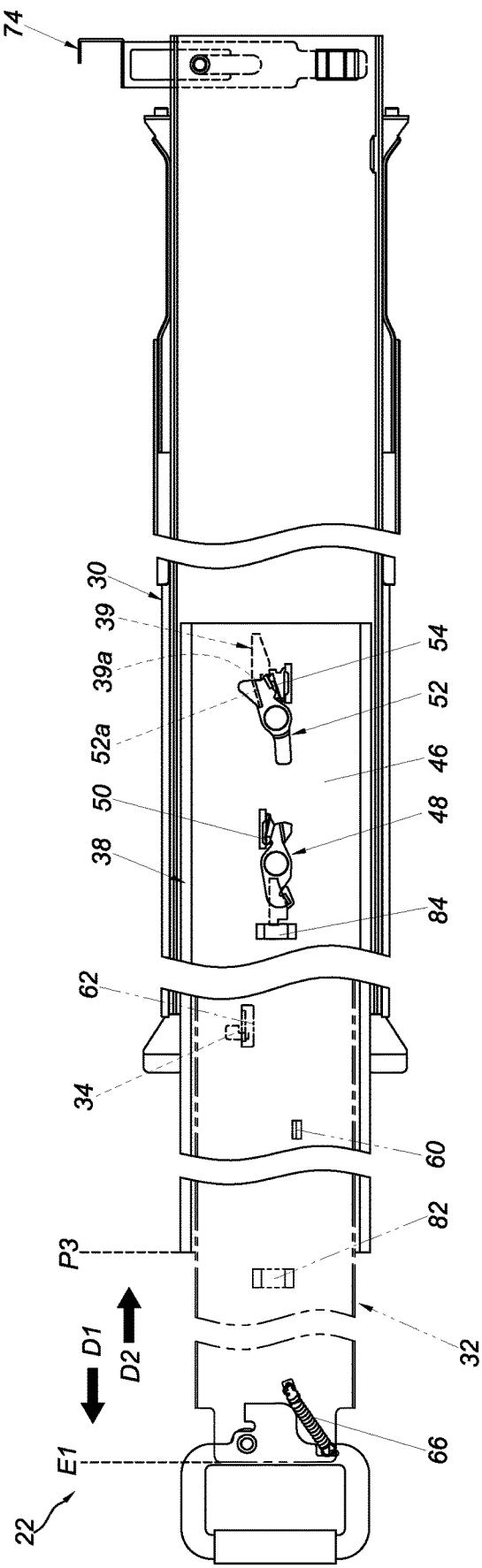
FIG. 11 is a schematic view showing that the second rail and the third rail of the slide rail assembly according to an embodiment of the present invention is displaced with respect to the first rail in the first direction in such a way that the slide rail assembly is now in an extended state.

Referring to FIG. 11, when the third rail 38 reaches a third position P3 after being displaced with respect to the first rail 30 in the first direction D1, the second element 52 is engaged with a blocking section 39a of the second working feature 39 to prevent the third rail 38 from being displaced with respect to the first rail 30 in a second direction D2, which is the opposite direction of the first direction D1. Furthermore, the second rail 32 can be further displaced with respect to the first rail 30 or the third rail 38 in the first direction D1 to an extended position E1 such that the slide rail assembly 22 enters an extended state. It is worth mentioning that the second element 52 has an extension section 52a extending through the third rail 38 (or more specifically the longitudinal wall 46) toward the first rail 30 in order to engage with the blocking section 39a of the second working feature 39.

Figure 12:
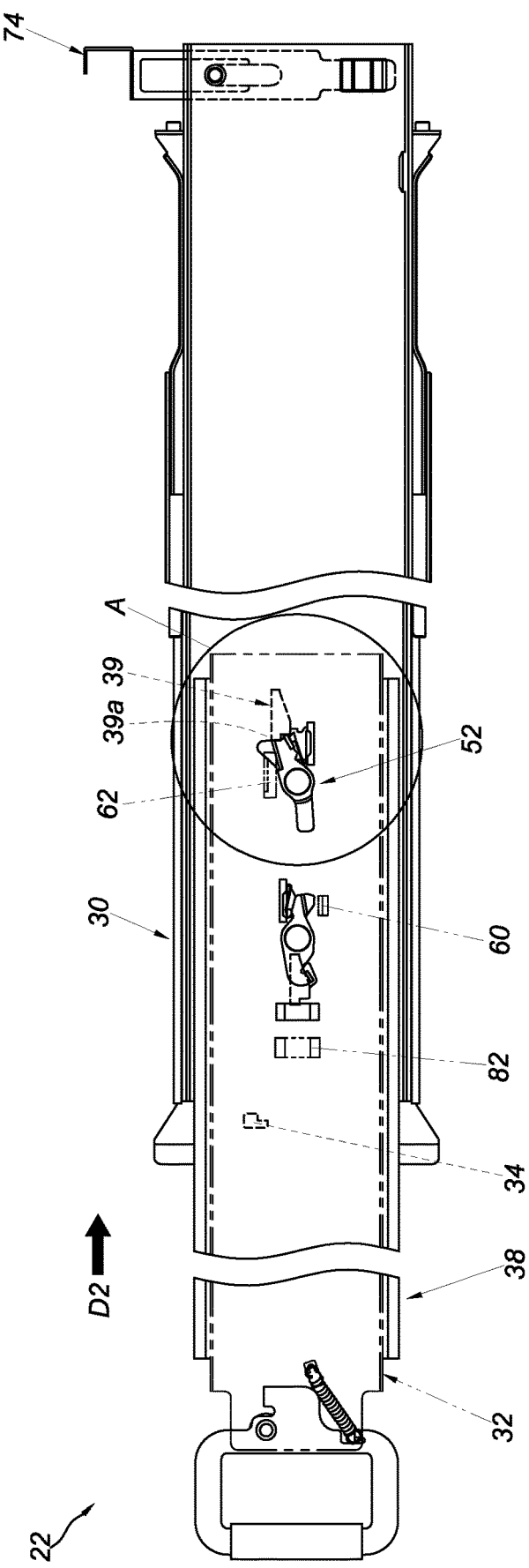
FIG. 12 is a schematic view showing that the second rail and the third rail of the slide rail assembly according to an embodiment of the present invention is displaced with respect to the first rail in a second direction.
Figure 13:
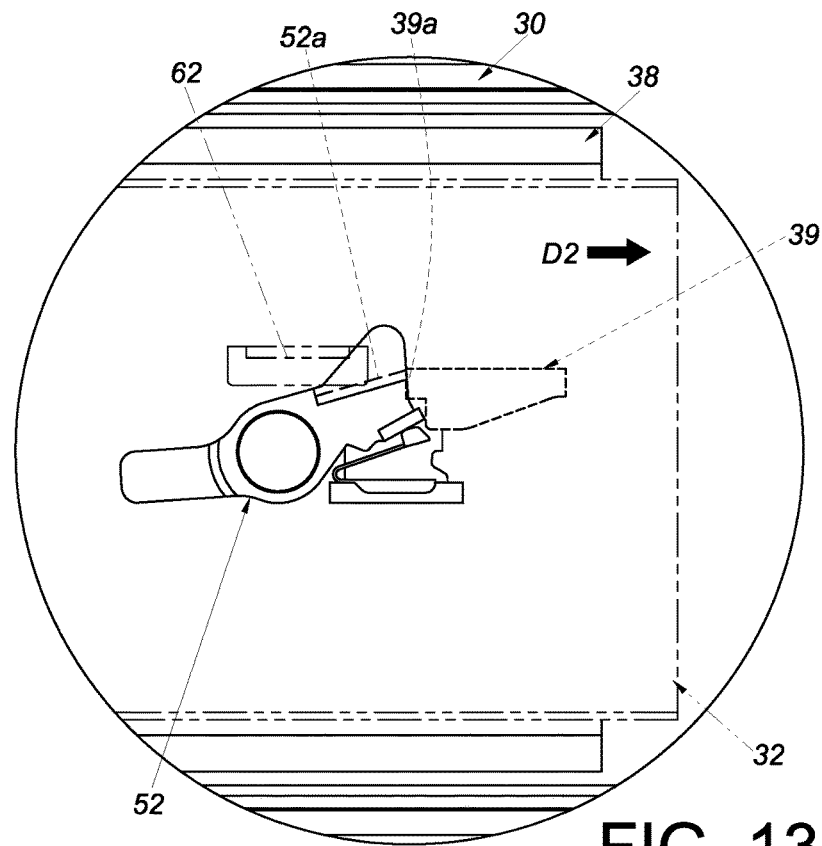
FIG. 13 is an enlarged view of the circled area A in FIG. 12.
Figure 14:
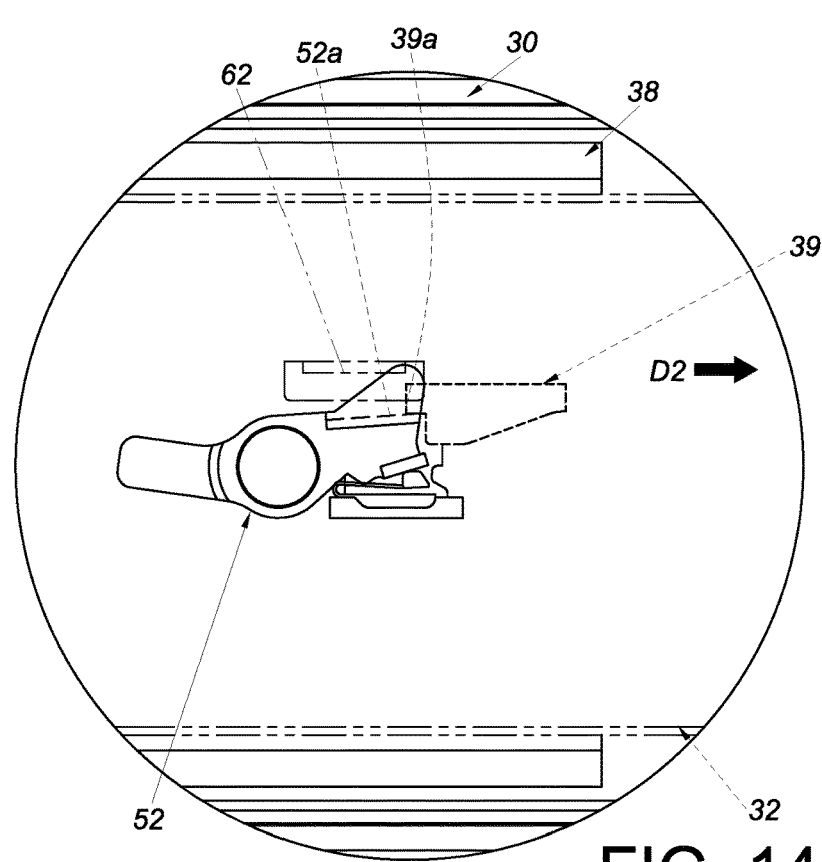
FIG. 14 is partial view showing that the second rail and the third rail of the slide rail assembly according to an embodiment of the present invention is further displaced with respect to the first rail in the second direction.

Referring to FIG. 12, FIG. 13, and FIG. 14, when the second rail 32 reaches a predetermined position after being displaced from the extended position E1 with respect to the third rail 38 in the second direction D2, the second feature 62 of the second rail 32 tilts the second element 52 by an angle, thereby disengaging the extension section 52a of the second element 52 from the blocking section 39a of the second working feature 39, allowing the third rail 38 to be displaced with respect to the first rail 30 in the second direction D2.

As shown in FIG. 15 and FIG. 16, one of the blocking member 34 and the operating member 36 has a guiding portion 86 such as an inclined or curved surface. Here, by way of example, it is the blocking member 34 that has the guiding portion 86 (see FIG. 4). When the operating member 36 is in the predetermined state S1, and the second rail 32 and the third rail 38 is displaced with respect to the first rail 30 in the second direction D2 such that the second rail 32 reaches a position close to the retracted position R after being displaced in the second direction D2, the operating member 36 can be directly moved past the blocking member 34, or pivoted past the blocking member 34, under the guidance of the guiding portion 86 so that the second rail 32 can be further retracted in the second direction D2 to the retracted position R.

Referring to FIG. 16 and FIG. 17, when the second rail 32 and the third rail 38 are at the retracted position R or in the retracted state with respect to the first rail 30, the first abutting portion 82 of the second rail 32 and the second abutting portion 84 of the third rail 38 abut against each other, and the blocking element 74 is in the blocking state Y1; consequently, one of the third rail 38 and the second rail 32 (e.g., the third rail 38) is kept from being displaced from the retracted position R in the second direction D2. More specifically, when the blocking element 74 is in the blocking state Y1, the first engaging feature 78 of the blocking element 74 is engaged with the second engaging feature 80 of the first rail 30 to block one of the third rail 38 and the second rail 32 (e.g., the second end portion 38b of the third rail 38, as shown in FIG. 2). Conversely, when the blocking element 74 is not in the blocking state Y1 (e.g., when a user applies an operating force F1 to the blocking element 74 and thereby brings the blocking element 74 from the blocking state Y1 to a non-blocking state Y2), one of the third rail 38 and the second rail 32 (e.g., the third rail 38) can be displaced from the retracted position R to another extended position E2 with respect to the first rail 30 in the second direction D2. With the first abutting portion 82 of the second rail 32 and the second abutting portion 84 of the third rail 38 abutting against each other, the third rail 38 and the second rail 32 can be simultaneously displaced from the retracted position R with respect to the first rail 30 in the second direction D2.

It can be known from the above that the slide rail assembly 22 preferably has the following features:

1. When the second rail 32 (and the third rail 38) are at a predetermined position, such as the retracted position R, with respect to the first rail 30, a blocking mechanism is in effect to prevent the second rail 32 (and the third rail 38) from displacement from the retracted position R in either the first direction D1 or the second direction D2.

2. When at the retracted position R with respect to the first rail 30, the second rail 32 (and the third rail 38) can be displaced from the retracted position R in the first direction D1 upon termination of the blocking relationship between the operating member 36 and the blocking member 34, or be displaced from the retracted position R in the second direction D2 if the blocking element 74 is not in the blocking state Y1. Thus, the second rail 32 (and the third rail 38) can be displaced from the retracted position R in either the first direction D1 or the second direction D2 to enable opening in either direction.

3. Simultaneous displacement of the second rail 32 and the third rail 38 can be carried out while the two rails are displaced from the retracted position R with respect to the first rail 30 in either the first direction D1 or the second direction D2.

4. In contrast to the prior art (e.g., U.S. Pat. No. 8,282,176 B1, according to which the locking member (20) can be operated via the release member (22) in order to be disengaged from the stop block (18)), the foregoing embodiments of the present invention allow the blocking relationship between the operating member 36 and the blocking member 34 to be terminated directly through operation of the operating member 36 (e.g., by the user applying a non-longitudinal force to the operating member 36), thereby allowing the second rail 32 to be displaced from the retracted position R with respect to the first rail 30 in the first direction D1. The embodiments of the present invention are simpler than the prior art in terms of structural configuration and can avoid such problems of the prior art (e.g., of U.S. Pat. No. 8,282,176 B1) as unexpected disengagement of the locking member (20) from the stop block (18) when the release member (22) is accidentally pulled out in the longitudinal direction.

5. When the second rail 32 is at the retracted position R with respect to the first rail 30, the handle portion 70 of the operating member 36 extends beyond the first end portion 30a of the first rail 30 (or the first bracket 26) by a predetermined distance to facilitate user operation.

6. The blocking member 34 or the blocking element 74 can be detached from the first rail 30 as needed.

While the present invention has been disclosed through the preferred embodiments described above, those embodiments are not intended to be restrictive of the scope of the invention. The scope of patent protection sought by the applicant is defined by the appended claims.

What is claimed is:

1. A slide rail assembly, comprising:
a first rail including a first end portion and a second end portion opposite the first end portion;
a second rail longitudinally displaceable with respect to the first rail;
a blocking member coupled to the first rail;
an operating member able to enter a predetermined state with respect to the second rail, the operating member including a handle portion;
a third rail movably mounted between the first rail and the second rail; and
a blocking element adjacent to the second end portion of the first rail;
wherein when the second rail is at a retracted position with respect to the first rail, the handle portion extends beyond the first end portion of the first rail by a predetermined distance, and the operating member is in the predetermined state and is blocked by the blocking member to prevent the second rail from displacement from the retracted position in a first direction;
wherein when the handle portion of the operating member is operated and moves the operating member out of the predetermined state, the operating member is no longer blocked by the blocking member and allows the second rail to be displaced from the retracted position in the first direction;
wherein when the second rail is at the retracted position, the blocking element is in a blocking state to prevent one of the third rail and the second rail from displacement from the retracted position in the second direction; and when the blocking element is not in the blocking state, one of the third rail and the second rail is displaceable from the retracted position to a second extended position with respect to the first rail in the second direction.

2. The slide rail assembly of claim 1, wherein the handle portion has a plurality of walls, and the walls jointly define an operating space.

3. The slide rail assembly of claim 1, wherein the operating member is movably arranged on the second rail.

4. The slide rail assembly of claim 3, wherein the operating member is pivotally connected to the second rail through a shaft, and the slide rail assembly further comprises an elastic component for applying an elastic force to the operating member and thereby keeping the operating member in the predetermined state.

5. The slide rail assembly of claim 4, wherein the operating member further includes a blocking portion, and the operating member in the predetermined state is blocked by the blocking member through the blocking portion.

6. The slide rail assembly of claim 5, further comprising a first element and a first elastic element, wherein the first element is pivotally connected to the third rail, the first elastic element applies an elastic force to the first element, and when the second rail reaches a first position after displacement from the retracted position in the first direction, a first feature of the second rail abuts against the first element to enable simultaneous displacement of the third rail and the second rail in the first direction.

7. The slide rail assembly of claim 6, further comprising a first working feature arranged on the first rail, wherein the first working feature includes a disengaging section, and when the third rail and the second rail reach a second position after simultaneous displacement with respect to the first rail in the first direction, the disengaging section of the first working feature moves the first element and thereby terminates a simultaneous displacement relationship between the third rail and the second rail.

8. The slide rail assembly of claim 7, further comprising a second working feature arranged on the first rail, wherein the second working feature includes a blocking section, the slide rail assembly further comprises a second element and a second elastic element, the second element is pivotally connected to the third rail, the second elastic element applies an elastic force to the second element, and when the third rail reaches a third position after displacement with respect to the first rail in the first direction, the second element is engaged with the blocking section of the second working feature in response to the elastic force of the second elastic element, thereby preventing the third rail from displacement with respect to the first rail in a second direction, which is the opposite direction of the first direction.

9. The slide rail assembly of claim 8, wherein when the second rail reaches a predetermined position after displacement from an extended position with respect to the third rail in the second direction, a second feature of the second rail moves the second element out of engagement with the blocking section of the second working feature, thereby allowing the third rail to be displaced with respect to the first rail in the second direction.

10. The slide rail assembly of claim 9, wherein one of the blocking member and the operating member has a guiding portion, and when the second rail reaches a position close to the retracted position after displacement in the second direction, the guiding portion guides the operating member to move past the blocking member to allow retraction of the second rail to the retracted position.

11. The slide rail assembly of claim 10, wherein the blocking member is adjacent to the first end portion of the first rail.

12. The slide rail assembly of claim 11, wherein the first end portion and the second end portion of the first rail are a front portion and a rear portion of the first rail respectively.

13. A slide rail assembly, comprising:
a first rail;
a second rail displaceable with respect to the first rail;
a blocking member coupled to the first rail;
an operating member able to enter a predetermined state with respect to the second rail;
a third rail movably mounted between the first rail and the second rail; and
a blocking element;
wherein when the second rail is at a retracted position with respect to the first rail, the operating member is in the predetermined state and is blocked by the blocking member to prevent the second rail from displacement from the retracted position in a first direction;
wherein when the operating member is not in the predetermined state and is therefore not blocked by the blocking member, the second rail is allowed to be displaced from the retracted position in the first direction;
wherein when the third rail and the second rail are at the retracted position, the blocking element is in a blocking state to prevent one of the third rail and the second rail from displacement from the retracted position in a second direction, which is the opposite direction of the first direction; and when the blocking element is not in the blocking state, one of the third rail and the second rail is displaceable from the retracted position with respect to the first rail in the second direction.

14. The slide rail assembly of claim 13, wherein the second rail and the third rail have a first abutting portion and a second abutting portion respectively, and when one of the third rail and the second rail is displaced from the retracted position with respect to the first rail in the second direction, the first abutting portion of the second rail and the second abutting portion of the third rail are able to abut against each other to enable simultaneous displacement of the third rail and the second rail from the retracted position with respect to the first rail in the second direction.

15. The slide rail assembly of claim 13, wherein the operating member is movably connected to the second rail.

16. The slide rail assembly of claim 15, wherein the operating member is pivotally connected to the second rail through a shaft, and the slide rail assembly further comprises an elastic component for applying an elastic force to the operating member and thereby keeping the operating member in the predetermined state.

17. The slide rail assembly of claim 16, wherein the operating member includes a blocking portion and a handle portion, the handle portion and the blocking portion are located on two sides of the shaft respectively, and the operating member in the predetermined state is blocked by the blocking member through the blocking portion.

* * * * *